(12) United States Patent
Nakao et al.

(10) Patent No.: US 6,426,789 B1
(45) Date of Patent: Jul. 30, 2002

(54) ALIGNER HAVING SHARED ROTATION SHAFT

(75) Inventors: Shuji Nakao; Teruaki Ishiba, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/834,632

(22) Filed: Apr. 16, 2001

(30) Foreign Application Priority Data

Dec. 13, 2000 (JP) ........................................ 2000-379196

(51) Int. Cl.$^7$ ........................ G03B 27/42; G03B 27/54; G03B 27/34

(52) U.S. Cl. ............................... 355/53; 355/67; 355/57

(58) Field of Search .............................. 355/53, 67, 57, 355/75; 356/399, 400, 401

(56) References Cited

FOREIGN PATENT DOCUMENTS

JP          5-343297        12/1993

*Primary Examiner*—Russell Adams
*Assistant Examiner*—Peter B. Kim
(74) *Attorney, Agent, or Firm*—McDermott, Will & Emery

(57) ABSTRACT

An illumination optical system is revolved at a given speed around a rotation shaft and emanates exposure light onto a reticle. The light having passed through the reticle is projected onto a semiconductor substrate, by means of a projection optical system which is revolved around the rotation shaft such that a relative positional relationship between the illumination optical system and the projection optical system is maintained.

9 Claims, 3 Drawing Sheets

Stepping movement

ALIGNER HAVING SHARED ROTATION SHAFT

BACKGROUND OF THE INVENTION

1. Field of the Invention

The present invention relates to a semiconductor manufacturing system, and more particularly, to an aligner for transferring a minute pattern, such as a semiconductor integrated circuit pattern.

2. Description of the Background Art

A scan stepper has hitherto been employed as an aligner at the time of forming a minute pattern such as a semiconductor integrated circuit, during semiconductor manufacturing processes.

A conventional aligner will be now described.

FIG. 5 is a conceptual view for describing a conventional aligner, and FIG. 6 is a conceptual view for describing exposing operation performed with the conventional aligner.

As shown in FIG. 5, reference numeral 101 designates an illumination optical system: 102 designates a reticle serving as an original transfer plate; 103 designates a projection optical system; and 104 designates a semiconductor substrate serving as a substrate on which a pattern is to be transferred.

In the aligner shown in FIG. 5, the illumination optical system 101 and the projection optical system 103 are fixed. While exposing operation is performed, the reticle 102 and the semiconductor substrate 104 are moved in synchronism with each other.

In more detail, as shown in FIG. 6, the reticle 102 and the semiconductor substrate 104 are moved over a slit-shaped exposing region 110, whereby a pattern 120 of the reticle 102 corresponding to the exposing region 110 is transferred onto the semiconductor substrate 104.

By means of moving the reticle 102 and the semiconductor substrate 104, the pattern 120 of the reticle 102, which extends beyond the exposing region 110, is transferred onto the semiconductor substrate 104.

However, in the above conventional aligner, a pattern 120 is exposed onto the semiconductor substrate 4 by means of moving the reticle 102 and the semiconductor substrate 104 in a synchronous manner in one direction. During a period between a single exposing operation for single shot (i.e., a single scanning operation) and the next exposing operation, the reticle 102 and the semiconductor substrate 104 are moved in the reverse direction.

For this reason, the conventional aligner must accelerate and decelerate the reticle 102 and the semiconductor substrate 104 for every scanning operation. Therefore, great stress is generated in the aligner.

The accuracy of pattern transfer is deteriorated by distortion or vibration ascribable to the stress.

SUMMARY OF THE INVENTION

The present invention has been conceived to solve the previously-mentioned problems and a general object of the present invention is to provide a novel and useful aligner for forming a semiconductor substrate by means of exposing, and is to provide a novel and useful method of manufacturing a semiconductor device using an aligner.

A more specific object of the present invention is to provide an aligner that forms a pattern on a semiconductor substrate with high accuracy.

A more specific another object of the present invention is to form a pattern on a semiconductor substrate with high accuracy by use of an aligner.

The above objects of the present invention are attained by a following aligner for forming a pattern on a semiconductor substrate by means of exposing, and by a following method of manufacturing a semiconductor device using an aligner.

According to one aspect of the present invention, aligner for forming a pattern on a semiconductor substrate by means of exposing comprises a rotation shaft; an illumination optical system which is revolved around the rotation shaft and emanates exposure light; a reticle through which the exposure light originating from the illumination optical system is passed; and a projection optical system which is revolved around the rotation shaft such that a relative positional relationship between the illumination optical system and the projection optical system is maintained, and the projection optical system projects the light passed through the reticle onto the semiconductor substrate.

In the aligner for forming a pattern on a semiconductor substrate by means of exposing, while exposing operation is performed, the illumination optical system and the projection optical system are revolved around the rotation shaft.

Therefore, there is obviated a necessity of moving the reticle back and forth for a single shot of exposing, which would otherwise be required by the conventional aligner. Thus, generation of stress can be prevented in the aligner, thereby enabling highly-accurate exposing of a pattern.

According to another aspect of the present invention, in a manufacturing method of a semiconductor device using aligner, exposure light is emanated onto a reticle from an illumination optical system, and the illumination optical system revolving around a rotation shaft in an emanation step. Next, the light passed through the reticle is projected onto a semiconductor substrate by way of a projection optical system, and the projection optical system revolving around the rotation shaft such that a relative positional relationship between the illumination optical system and the projection optical system is maintained in a projection step.

In the method of manufacturing a semiconductor device, generation of stress can be prevented in the aligner, thereby enabling highly-accurate exposing of a pattern, as well as the above-mentioned aligner.

Other objects and further features of the present invention will be apparent from the following detailed description when read in conjunction with the accompanying drawings.

DETAILED DESCRIPTION OF THE PREFERRED EMBODIMENTS

Figure 1:
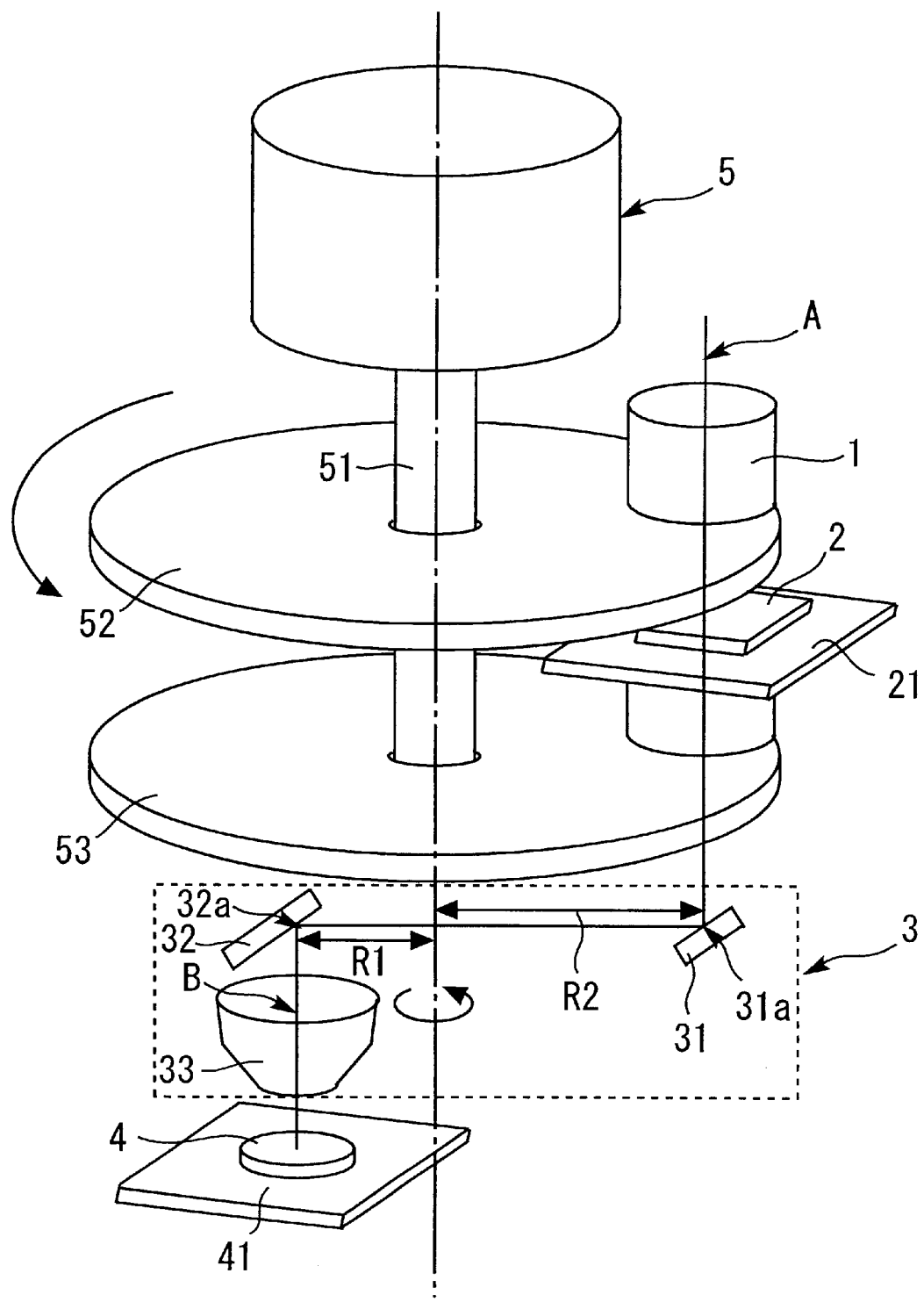
FIG. 1 is a conceptual view for describing an aligner, according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is a conceptual view for describing an aligner, according to a first embodiment of the present invention.

As shown in FIG. 1, reference numeral 1 designates an illumination optical system; 2 designates a reticle; 21 designates a reticle holder; 3 designates a projection optical system; 31 designates a first reflection mirror; 32 designates a second reflection mirror; and 33 designates a projection lens. Moreover, reference numeral 4 designates a semiconductor substrate; 41 designates a stage; 5 designates a support/rotation mechanism; 51 designates a rotation shaft; 52 designates a rotary plate; and 53 designates a support plate.

The illumination optical system 1 emanates exposure light onto the reticle 2. The illumination optical system 1 is disposed on the rotary plate 52, and the system 1 is revolved around the rotation shaft 51 in conjunction with rotation of the rotary plate 52.

The reticle 2 is an original transfer plate having a pattern drawn thereon. The exposure light emanated from the illumination optical system 1 is passed through the reticle 2. The reticle 2 is held by the reticle holder 21. The reticle 2 and the reticle holder 21 are placed on the support plate 53, which does not rotate.

The projection optical system 3 is disposed on a rotary plate (not shown) of the support/rotation mechanism 5, and the system 3 is revolved around the rotation shaft 51 such that the relative positional relationship (to be described later) between the projection optical system 3 and the illumination optical system 1 is maintained. The projection optical system 3 projects the light passed through the reticle 2 onto the semiconductor substrate 4. More specifically, the projection optical system 3 transfers an inverted-and-reversed image of the pattern of the reticle 2 onto the semiconductor substrate 4.

The projection optical system 3 comprises a first reflection mirror 31, a second reflection mirror 32 and a projection lens 33. The two reflection mirrors 31 and 32 and the projection lens 33 are disposed on the rotary plate (not shown), and are revolved around the rotation shaft 51 so as to maintain a positional relationship to be described later; i.e., a relative positional relationship among the reflection mirrors 31 and 32, the projection lens 33 and the illumination optical system 1.

The first reflection mirror 31 is disposed such that a reflection surface 31a is spaced distance R2 away from the axis of the rotation shaft 51. The second reflection mirror 32 is disposed such that a reflection surface 32a is spaced distance R1 away from the axis of the rotation shaft 51. The projection lens 33 is interposed between the second reflection mirror 32 and the semiconductor substrate 4.

Here, "R1" is the distance from the reflection surface 32a to the axis of the rotation shaft 51 (i.e., a distance from an optical axis B to be projected on the semiconductor substrate 4 to the axis of the rotation shaft 51), and "R2" is the distance from the reflection surface 31a to the axis of the rotation shaft 51 (i.e., a distance from an optical axis A passing through the reticle 2 to the axis of the rotation shaft 51). Further, a ratio of R2 to R1 (R2/R1) accurately matches a scale-down factor.

Hence, geometrical similarity equal to the scale-down factor (R2/R1) exists between the movement of an exposing region 20 on the reticle 2 relative to the rotation shaft 51 and the movement of an exposing region on the semiconductor substrate 4 relative to the rotation shaft 51.

The first reflection mirror 31 reflects the light passed through the reticle 2 in a horizontal direction. The second reflection mirror 32 reflects the light reflected from the first reflection mirror 31 in the direction perpendicular to the surface of the semiconductor substrate 4; that is, toward the projection lens 33. The projection lens 33 projects the light reflected from the second reflection mirror 32 onto the semiconductor substrate 4 in a scaled-down manner.

The semiconductor substrate 4 is a wafer coated with, for example, a photosensitive agent (photoresist). The semiconductor substrate 4 is held by the stage 41, which does not rotate. After having been exposed to a single shot of pattern, the semiconductor substrate 4 is moved in a stepwise manner by means of the stage 41 (Stepping movement shown in FIG. 3).

The support/rotation mechanism 5 comprises the rotation shaft 51, the rotary plate 52 and the support plate 53. Further, the support/rotation mechanism 5 comprises a rotary plate (not shown) which rotates around the rotation shaft 51. The projection optical system 3 is disposed on the rotary plate.

The illumination optical system 1 is disposed on the primary surface of the rotary plate 52, and the rotary plate 52 rotates around the rotation shaft 51.

The support plate 53 is for holding the reticle holder 21, and the support plate 53 is fixed, i.e. not rotate.

The illumination optical system 1 and the projection optical system 3 are revolved at a given speed by means of the respective rotary plates of the support/rotation mechanism 5. Preferably, the speed is set within the range of 0.5 to 3.0 m/sec. The reason for this is that, if the speed assumes a value of under 0.5 m/sec., throughput becomes insufficient. In contrast, if the speed exceeds 3.0 m/sec., fixation of the projection lens 33 becomes difficult.

The above-described aligner can be summarized as follows: the illumination optical system 1 emanates exposure light while revolving around the rotation shaft 51. The reticle 2 pass through the exposure light originating from the illumination optical system 1. The projection optical system 3 is revolved around the rotation shaft 51 such that the relative positional relationship between the illumination optical system 1 and the projection optical system 3, and the projection optical system 3 projects the light passed through the reticle 2 onto the semiconductor substrate 4.

Next, with reference to FIGS. 1 to 4, the exposing method using the aligner according to the present embodiment will now be described.

Figure 2:
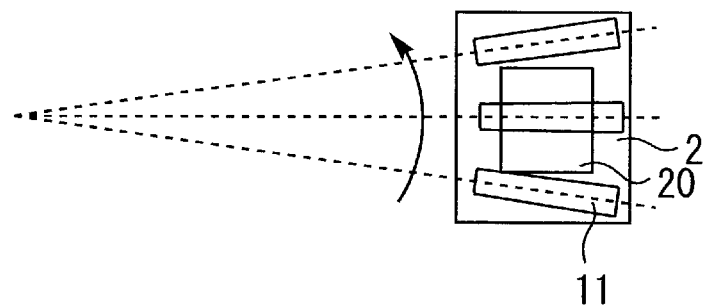
FIG. 2 is a view for describing the movement of the exposing region on the reticle during an exposing operation using the aligner according to the first embodiment.
Figure 3:
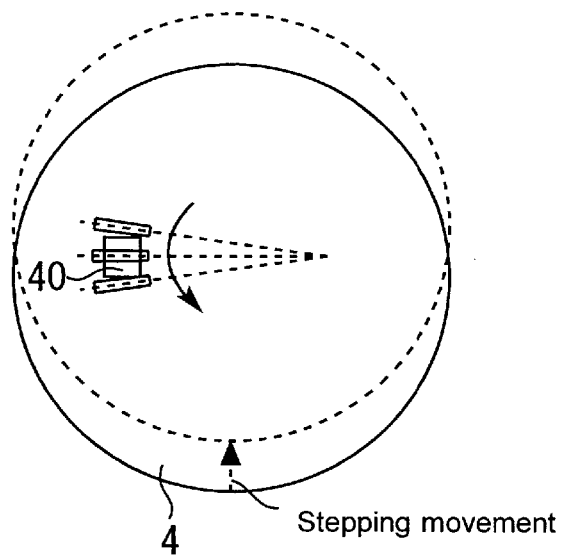
FIG. 3 is a view for describing exposing of a pattern on a semiconductor substrate during an exposing operation using the aligner according to the first embodiment.
Figure 4:
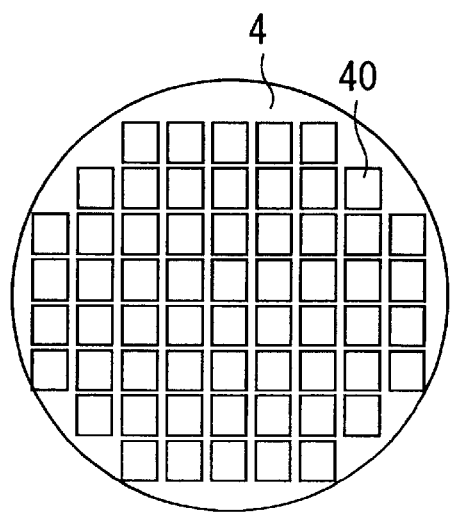
FIG. 4 is a view for describing a semiconductor substrate after finished exposing operation performed by the aligner according to the first embodiment.
Figure 5:
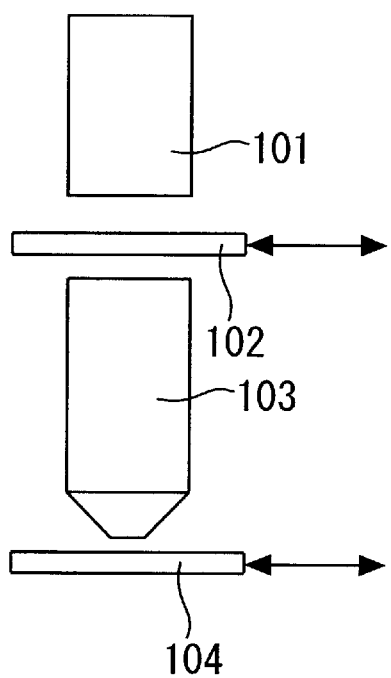
FIG. 5 is a conceptual view for describing a conventional aligner.
Figure 6:
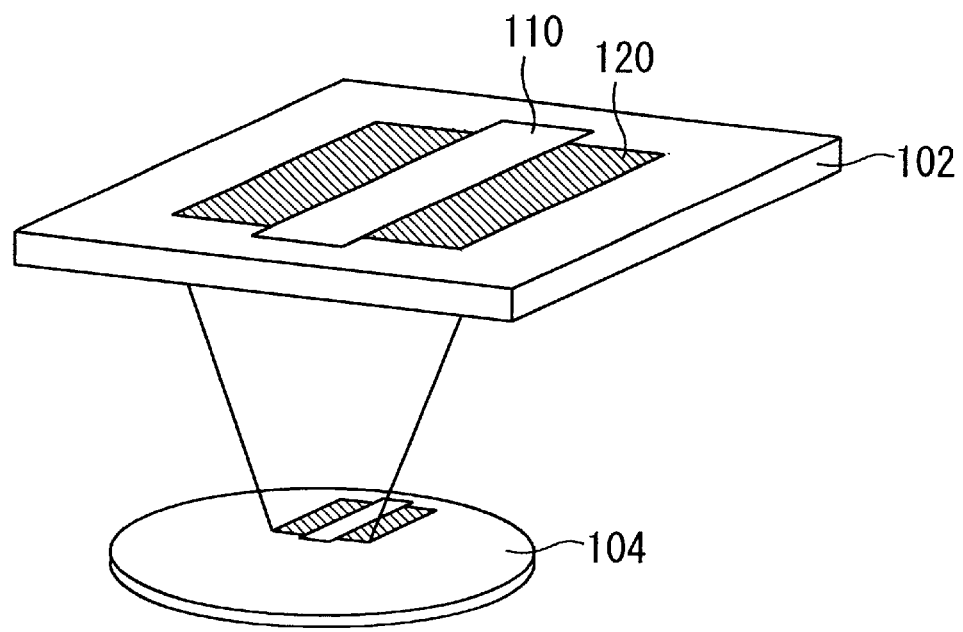
FIG. 6 is a conceptual view for describing exposing operation performed with the conventional aligner.

FIG. 2 is a view for describing the movement of the exposing region on the reticle during an exposing operation using the aligner according to the present embodiment. FIG. 3 is a view for describing exposing of a pattern on a semiconductor substrate during an exposing operation using the aligner according to the present embodiment. FIG. 4 is a view for describing a semiconductor substrate after finished exposing operation performed by the aligner according to the present embodiment.

As shown in FIG. 1, the illumination optical system 1 is revolved around the rotation shaft 51, and the illumination optical system 1 emanates exposure light onto the reticle 2. The projection optical system 3 is revolved around the rotation shaft 51 as well as the illumination optical system. Here, the illumination optical system 1 and the projection optical system 3 are revolved around the rotation shaft 51 in conjunction with each other such that the relative positional relationship between the illumination optical system 1 and the projection optical system 3 (described previously) is maintained. The illumination optical system 1 and the projection optical system 3 are revolved at a given speed, wherein the speed is set within a range of 0.5 to 3.0 m/sec.

As shown in FIG. 2, when the illumination optical system 1 is revolved in the manner as mentioned above, the wedge-shaped exposing region (exposing slit) 11 is moved over the pattern 20 of the reticle 2.

Here, an integrated amount of exposure light (illumination light) at an arbitrary point on the pattern 20 of the reticle 2 over which the exposing region 11 has moved becomes uniform.

Next, the light passed through the reticle 2 is projected onto the semiconductor substrate 4 by means of the projection optical system 3.

More specifically, the light passed through the reticle 2 is reflected by the first reflection mirror 31 in a horizontal direction, wherein the reflection surface 31a of the first reflection mirror 31 is spaced only distance R2 away from the axis of the rotation shaft 51.

Next, the light reflected from the first reflection mirror 31 is reflected by the second reflection mirror 32 in a perpendicular direction; that is, toward the projection lens 33, wherein the reflection surface 32a of the second reflection mirror 32 is spaced only distance R1 away from the axis of the rotation shaft 51.

Next, the light reflected from the second reflection mirror 32 is projected onto the semiconductor substrate 4 by way of the projection lens 33.

As shown in FIG. 3, by means of the above-described exposing operation, the image of the pattern 20 of the reticle 2, which is exposed through the exposing region 11, is formed on the semiconductor substrate 4 as an inverted-and-reduced image (40).

Here, as shown in FIG. 1, the illumination optical system 1 and the projection optical system 3 are disposed such that the ratio of distance R2 from the optical axis A to the axis of the rotation shaft 51 to distance R1 from the optical axis B to the axis of the rotation shaft 51; that is, R2/R1, becomes identical with the scale-down factor by which the pattern 20 on the reticle 2 is to be pattern 40 onto the semiconductor substrate 4 by means of exposing.

Accordingly, a reduced pattern 40 which is symmetrical about the pattern 20 on the reticle 2 and converges with respect to a point on the rotation shaft 51 is patterned onto the semiconductor substrate 4 by means of a single shot of exposing.

After the semiconductor substrate 4 has been moved stepwise in the manner (Stepping movement) as shown in FIG. 3, the above-mentioned exposing operations are repeated.

After all the exposing operations have been completed, a plurality of patterns 40 are formed over the entire surface of the semiconductor substrate 4, as shown in FIG. 4.

As described above, in the aligner and the exposing method according to the first embodiment, the illumination optical systems 1 and the projection optical system 3 are revolved around the rotation shaft 51, and the pattern 20 drawn on the reticle 2 is patterned onto the semiconductor substrate 4 through exposing.

There is obviated a necessity of moving the reticle 2 back and forth every exposing of a single shot, which would otherwise be required by the conventional aligner. Thus, generation of stress can be prevented in the aligner. Therefore, distortion and vibration of the aligner can be prevented, thereby enabling highly-accurate exposing of a pattern.

The optical systems 1 and 3 are revolved at a given speed, hence exposing operation can be performed stably, thereby enabling highly-accurate exposing of a pattern. Further, the speed is set to a value ranging from 0.5 to 3.0 m/sec., thereby improving throughput.

The above-mentioned aligner has a pair of optical systems; that is, one illumination optical system 1 and one projection optical system 3. The aligner may be provided with a plurality of sets of optical systems. In this case, exposing operation can be performed a plurality of times during a single rotation-of the rotation table 52. Therefore, throughput can be improved to a much greater extent.

Further, a plurality of pairs of optical systems 1 and 3 are disposed at uniform intervals around the rotation shaft 51, thereby improving a balance in weight of the aligner. Accordingly, distortion or vibration of the aligner can be prevented, thereby enabling a further stable exposing operation. Further, as mentioned above, exposing operation is performed at a given rotation speed, thereby enabling considerably-stable exposing operation. Hence, a pattern can be exposed at high speed and with high accuracy.

The balance in weight of the aligner can be improved, by means of arranging weights which are equal in weight and center of gravity with the optical systems 1 and 3, thereby enabling stable exposing of a pattern.

The plurality of illumination optical systems 1 which emanate exposure light of respective different wavelengths, or the plurality projection optical system 3 having lenses of respective different numerical apertures (N.A.) may be used. Thus, exposure under a plurality of exposing conditions can be performed in the aligner.

The aligner according to the present embodiment may be provided with a plurality of reticles 2 and a plurality of semiconductor substrates 4 corresponding to the reticles 2. As a result, the plurality of semiconductor substrates 4 can be exposed to the light during a single rotation of the optical systems 1 and 3. Therefore, throughput can be improved. In addition, if the aligner employs the above-mentioned plurality of sets of optical systems 1 and 3, the throughput can be improved to much a greater extent.

This invention, when practiced illustratively in the manner described above, provides the following major effects:

According to a first aspect of the present invention, generation of stress in an aligner can be prevented, thereby enabling highly-accurate exposing of a pattern.

In a preferred variation of the present invention, an inverted-and-reduced image of a reticle can be exposed onto a semiconductor substrate with high accuracy by means of exposing.

In a preferred variation of the present invention, an illumination optical system and a projection optical system are revolved at a given speed, thereby enabling stable exposing of a pattern.

In a preferred variation of the present invention, since the speed is set within the range of 0.5 to 3.0 m/sec., throughput can be improved.

In a preferred variation of the present invention, a balance in weight of the aligner can be improved, and stable exposing of a pattern can be performed. Further, throughput can be improved.

In a preferred variation of the present invention, a pattern can be exposed under different exposing conditions.

In a preferred variation of the present invention, a pattern can be patterned onto a plurality of semiconductor substrates by means of exposing, thereby improving throughput.

Further, the present invention is not limited to these embodiments, but variations and modifications may be made without departing from the scope of the present invention.

The entire disclosure of Japanese Patent Application No. 2000-379196 filed on Dec. 13, 2000 containing specification, claims, drawings and summary are incorporated herein by reference in its entirety.

What is claimed is:

1. An aligner for forming a pattern on a semiconductor substrate by means of exposing comprising:

a rotation shaft;

an illumination optical system which is revolved around said rotation shaft and emanates exposure light, an optical axis of said exposure light is different from said rotation shaft;

a reticle through which said exposure light originating from said illumination optical system is passed; and a projection optical system which is revolved around said rotation shaft such that a relative positional relationship between said illumination optical system and said projection optical system is maintained, and said projection optical system projecting said light passed through said reticle onto said semiconductor substrate.

2. The aligner for forming a pattern on a semiconductor substrate by means of exposing according to claim 1, wherein said projection optical system includes a first reflection mirror, a second reflection mirror and a projection lens, which are disposed such that a relative positional relationship to said illumination optical system is maintained;

said first reflection mirror reflects said light passed through said reticle in a horizontal direction;

said second reflection mirror reflects said light reflected from said first reflection mirror in a vertical direction; and said projection lens projects said light reflected from said second reflection mirror onto said semiconductor substrate in a scale-down manner.

3. The aligner for forming a pattern on a semiconductor substrate by means of exposing according to claim 2, wherein the ratio of a distance from an axis of said rotation shaft to a reflection surface of said first reflection mirror to a distance from said axis of said rotation shaft to a reflection surface of said second reflection mirror is equal to a scale-down factor of said projection lens.

4. The aligner for forming a pattern on a semiconductor substrate by means of exposing according to claim 1, wherein said illumination optical system and said projection optical system are revolved at a given speed.

5. The aligner for forming a pattern on a semiconductor substrate by means of exposing according to claim 4, wherein said illumination optical system and said projection optical system are revolved at a speed of 0.5 to 3.0 m/sec.

6. The aligner for forming a pattern on a semiconductor substrate by means of exposing according to claim 1, wherein a plurality of illumination optical systems are provided around said rotation shaft at uniform intervals, and a plurality of projection optical systems are provided so as to correspond to said respective illumination optical systems.

7. The aligner for forming a pattern on a semiconductor substrate by means of exposing according to claim 6, wherein said plurality of illumination optical systems include illumination optical systems which emanate exposure light of different wavelengths.

8. The aligner for forming a pattern on a semiconductor substrate by means of exposing according to claim 6, wherein said plurality of projection optical systems include projection optical systems having lenses of different numerical apertures.

9. The aligner for forming a pattern on a semiconductor substrate by means of exposing according to claim 1, wherein a plurality of reticles are provided around said rotation shaft, and a plurality of semiconductor substrates are provided around said rotation shaft so as to correspond to said respective reticles.

* * * * *